United States Patent
Kim

(10) Patent No.: US 7,929,100 B2
(45) Date of Patent: Apr. 19, 2011

(54) FLEXIBLE PRINTED CIRCUIT BOARD AND LIQUID CRYSTAL DISPLAY DEVICE USING THE SAME

(75) Inventor: Wal-Hee Kim, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 242 days.

(21) Appl. No.: 12/167,743

(22) Filed: Jul. 3, 2008

(65) Prior Publication Data
US 2009/0040415 A1 Feb. 12, 2009

(30) Foreign Application Priority Data
Jul. 5, 2007 (KR) .................. 10-2007-0067734

(51) Int. Cl.
*G02F 1/1345* (2006.01)
(52) U.S. Cl. .................. 349/150; 349/152
(58) Field of Classification Search .......... None
See application file for complete search history.

(56) References Cited

U.S. PATENT DOCUMENTS

| | | | |
|---|---|---|---|
| 6,266,119 B1 | 7/2001 | Takahashi et al. | |
| 6,972,966 B1 * | 12/2005 | Oishi et al. | 361/803 |
| 7,385,143 B2 * | 6/2008 | Ho et al. | 174/254 |
| 2003/0007331 A1 * | 1/2003 | Kataoka | 361/749 |
| 2004/0156583 A1 * | 8/2004 | Totani et al. | 385/24 |
| 2005/0179850 A1 | 8/2005 | Du | |
| 2006/0032665 A1 | 2/2006 | Ice | |
| 2006/0082715 A1 * | 4/2006 | Lo et al. | 349/150 |
| 2006/0114694 A1 * | 6/2006 | Cho et al. | 362/631 |
| 2006/0264093 A1 | 11/2006 | Shim | |

FOREIGN PATENT DOCUMENTS

| | | |
|---|---|---|
| JP | 2003-92020 | 3/2003 |
| JP | 2005-61063 | 3/2005 |

OTHER PUBLICATIONS

English Abstract for Publication No. 2005-61063.
English Abstract for Publication No. 2003-92020.

* cited by examiner

*Primary Examiner* — Hemang Sanghavi
(74) *Attorney, Agent, or Firm* — F. Chau & Associates, LLC

(57) ABSTRACT

A flexible printed circuit board for use in a liquid crystal display device includes: a body section having a light source portion embedded therein; a leg section including a solder pad connected to an external printed circuit board, the leg section being extended from the body section and integrally formed with the body section; and a single conductive layer formed across the body section and the leg section for electrically interconnecting the light source portion and the solder pad.

14 Claims, 4 Drawing Sheets

FLEXIBLE PRINTED CIRCUIT BOARD AND LIQUID CRYSTAL DISPLAY DEVICE USING THE SAME

CROSS-REFERENCE TO RELATED APPLICATION

This application claims priority from and the benefit of Korean Patent Application No. 10-2007-0067734, filed on Jul. 5, 2007 in the Korean Intellectual Property Office, the contents of which are herein incorporated by reference in their entirety.

BACKGROUND OF THE INVENTION

1. Technical Field

The present disclosure is directed to a liquid crystal display device, and more particularly to, a flexible printed circuit board for use in a liquid crystal display device.

2. Discussion of Related Art

In general, a liquid crystal display ("LCD") device refers to a device in which a thin film transistor ("TFT") substrate and a color filter substrate, which are formed with an electric field generating electrode, are disposed in such a fashion that surfaces of the substrates formed with the electrode face each other. A liquid crystal layer is disposed between the two substrates, and then a voltage is applied across the electrodes of the substrates to generate an electric field to cause liquid crystals to be twisted, so that an image is displayed based on transmittance of light varying accordingly.

To this end, the liquid crystal display device includes a liquid crystal panel for displaying an image, a driving unit for driving the liquid crystal panel and a backlight unit for radiating light onto the liquid crystal panel. Currently, the backlight unit mainly employs, as a light source, a cylindrical linear light source lamp such as a cold cathode fluorescent lamp (CCFL), an external electrode fluorescent lamp (EEFL), or the like. However, such a cylindrical linear light source lamp requires a light guide plate having a dimension corresponding to a tube diameter of the lamp and a reflective plate for allowing light to be emitted in all directions, which becomes an obstacle to slimness of products adopting a liquid crystal module.

Presently, to address this issue, the backlight unit employs a light emitting diode ("LED") having a small thickness, which is driven with low power, as a light source. In the liquid crystal display employing the light emitting diode as a backlight, a flexible printed circuit board ("FPCB") embedded with the LED is securely attached to a light guide plate or a bottom case by means of a double coated tape. Also, the FPCB embedded with the LED is joined by soldering to a main substrate for providing a driving voltage.

However, a conventional FPCB for the LED has a dual conductive layer structure including a power-supplying conductive layer connected to the LED and a soldering conductive layer connected to a solder pad. In the conventional FPCB for the LED, since a single conductive layer needs an adhesive layer and a cover layer, the soldering conductive layer, which is not used for the purpose of supplying power, may cause an increase in the thickness of the FPCB to thereby deteriorate flexibility of the FPCB and raise the manufacturing cost.

SUMMARY OF THE INVENTION

Embodiments of the present invention provide an FPCB including a single conductive layer and a liquid crystal display device using the FPCB.

In an exemplary embodiment of the present invention, there is provided an FPCB comprising: a body section having a light source portion embedded therein; a leg section including a solder pad connected to an external printed circuit board, the leg section being extended from the body section and integrally formed with the body section; and a single conductive layer formed across the body section and the leg section for electrically interconnecting the light source portion and the solder pad.

The body section further includes a first cover layer and a second cover layer, and the single conductive layer is formed between the first cover layer and the second cover layer.

A region where the solder pad of the leg section is formed further includes the first cover layer, and the single conductive layer is formed between the first cover layer and the solder pad.

In another exemplary embodiment of the present invention, there is provided a liquid crystal display device including: a first circuit board having first and second conductive layers formed therein and a first solder pad formed therein electrically connected to the first conductive layer; and a second circuit board having a second solder pad formed therein to be soldered to the first solder pad and a third conductive layer formed therein electrically connected to the second solder pad.

The first solder pad of the first circuit board has via holes formed therein.

The first circuit board has a power supply unit embedded therein positioned at one side of a region thereof where the first solder pad is formed, the power supply unit being electrically connected to the first conductive layer.

The second circuit board may have a light source portion embedded therein electrically connected to the third conductive layer. Also, the light source portion includes a light emitting diode (LED).

Also, the first and second solder pads may be soldered to each other through the filling of solder into via holes in close contact with each other.

The first circuit board is an FPCB or a printed circuit board, and the second circuit board is an FPCB.

In still another exemplary embodiment of the present invention, there is provided a method of fabricating a liquid crystal display device, comprising the steps of: providing a first circuit board having first and second conductive layers formed therein and a first solder pad formed therein electrically connected to the first conductive layer, the first solder pad having via holes formed therein; providing a second circuit board having a second solder pad formed therein to be soldered to the first solder pad and a third conductive layer formed therein electrically connected to the second solder pad; allowing the second solder pad of the second circuit board to be in close contact with the first solder pad having the via holes formed therein; and soldering the first soldering pad and the second soldering pad to each other through the filling of a solder into the via holes from the first circuit board side.

The FPCB of the present invention includes a single conductive layer for electrically interconnecting the LED packages and the solder pad, and can be attachably soldered to the main circuit board by using the double-conductive layer structure of the main circuit board including the first conductive layer and the second conductive layer.

Accordingly, an LED FPCB of an embodiment of the present invention has an effect in that it includes only a single conductive layer, as opposed to an LED FPCB employing a double conductive layer used in a conventional liquid crystal display device, decreasing the thickness of the FPCB to increase flexibility of the FPCB and reduce the manufacturing cost.

BRIEF DESCRIPTION OF THE DRAWINGS

Exemplary embodiments of the present invention will be understood in more detail from the following descriptions taken in conjunction with the attached drawings.

DETAILED DESCRIPTION OF EXEMPLARY EMBODIMENTS

Reference will now be made in detail to an exemplary embodiment of the present invention with reference to the attached drawings.

Figure 1:
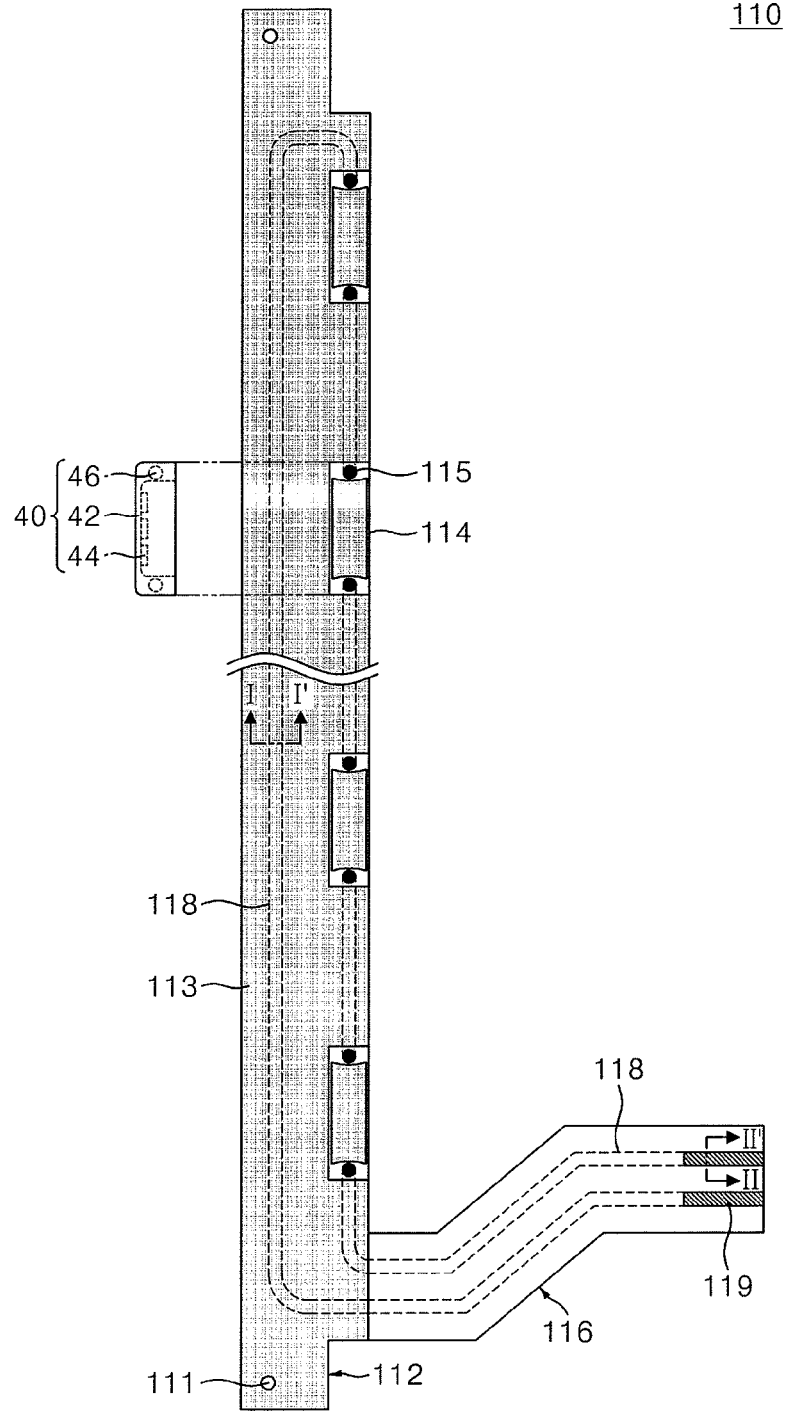
FIG. 1 is a schematic view showing an LED FPCB according to an embodiment of the present invention.

FIG. 1 is a schematic view showing an LED FPCB (FPCB) according to an embodiment of the present invention.

As shown in FIG. 1, the LED FPCB 110 according to an embodiment of the present invention includes a body section 112 and a leg section 116.

The body section 112 has a plurality of LED packages 40 embedded therein. The body section 112 is an element which is attached to an edge of a light guide plate (not shown) and is integrally formed with the leg section 116.

More specifically, the body section 112 is provided with a plurality of LED-embedding portions 114 each having an LED package 40 embedded therein. In this case, the LED package 40 is formed by accommodating at least one LED 44 in a package housing 42. Both electrodes of the LED 44 are electrically connected to terminals 46 formed at the package housing 42.

The LED-embedding portion 114 is formed with solders 115 corresponding to the terminals 46 of the LED package 40 and a power supply wiring 118 of a single layer is disposed in the body section 112. The solders 115 of the plurality of LED-embedding portions 114 are interconnected by means of the power supply wiring 118 disposed inside the body section 12. The terminals 46 of the LED package 40 are electrically connected to the solders 115 of a corresponding LED embedding portion 114 by means of soldering. Thus, the single-layered power supply wiring 118 can provide an LED driving power supplied from the outside to an LED 44 of each LED package 40.

An adhesive tape 113 is attached to a surface of the body section 112 in which the LED-embedding portions 114 are formed. The adhesive tape 113 includes a reflective material for reflecting light. Fastening portions 111 may be further formed at both edges of the body section 112 to be joined to a mold frame (not shown) to prevent any movement of the LED FPCB 110.

The leg section 116 is an element which is formed with a solder pad 119 electrically connected to a main circuit board (now shown). The leg section 116 is extended from the body section 112 and is integrally formed with the body section 112.

More specifically, the leg section 116 has a power supply wiring 118 formed therein in such a fashion as to be extended from the power supply wiring 118 disposed in the body section 112. The power supply wiring 118 is formed at a distal end thereof with a solder pad 119 soldered to a solder pad of another printed circuit board. In this case, the other printed circuit board is a printed circuit board ("PCB") which is embedded with an LED power supply unit and is formed with a solder pad connected to the power supply unit, and may be a PCB or a FPCB. Thus, when the LED FPCB 110 is connected to the other printed circuit board by means of soldering, the LED driving power supplied to the LED FPCB 110 through the solder pad 119 can be supplied to the LED 44 of the LED package 40 via the power supply wiring 118 disposed in the leg section 116 and the body section 112.

In this embodiment, the LED FPCB 110 includes the LED-embedding portion 114 embedded with the LED package 40. In this case, the LED-embedding portion 114 is not limited thereto but, for example, may have a structure in which the LED can be embedded directly.

Figure 2A:
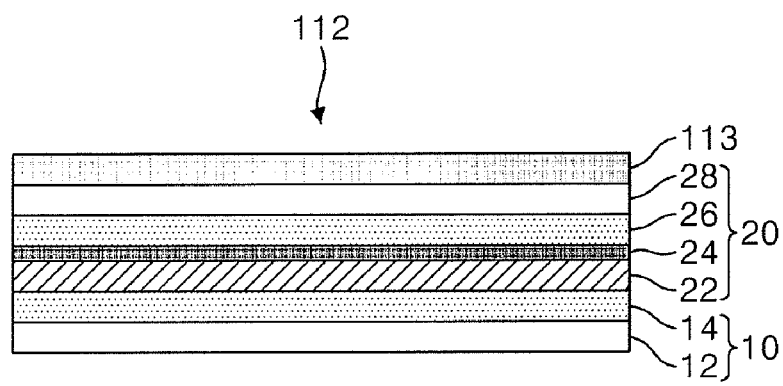
FIG. 2A is a cross-sectional view showing an LED FPCB taken along line I-I' of FIG. 1.

FIG. 2A is a cross-sectional view showing an LED FPCB taken along the line I-I' of FIG. 1.

As shown in FIG. 2A, the body section 112 of the LED FPCB includes a frame layer 10 comprising a first cover layer 12 and a first adhesive layer 14, a unit layer 20 comprising a conductive layer 22, a second adhesive layer 26 and a second cover layer 28, and an adhesive tape 113.

The first cover layer 12 and the second cover layer 28 constitute the shape of the outer appearance of the LED FPCB and serve to insultingly protect the conductive layer 22 formed between the first cover layer 12 and the second cover layer 28 from the outside. The first cover layer 12 and the second cover layer 28 may be formed of polyimide. The first and the second adhesive layers 14 and 26 serve to adhere the conductive layer 22 to the first cover layer 12 and the second cover layer 28.

The conductive layer 22 is a layer constituting the power supply wiring (118 of FIG. 1), and may be formed of a metal material having a good electrical conductivity. The metal material may be a copper or a copper alloy. The conductive layer 22 may further include a plated layer 24 formed of a copper or a copper alloy. The adhesive tape 113 serves to adhere the body section 112 of the LED FPCB to the light guide plate, and includes a reflective material for reflecting light. The reflective material may be directly coated on the second cover layer 28 by means of printing, etc.

Figure 2B:
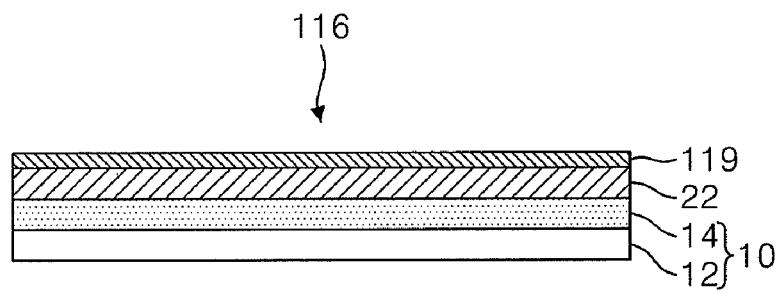
FIG. 2B is a cross-sectional view showing an LED FPCB taken along line II-II' of FIG. 1.

FIG. 2B is a cross-sectional view showing an LED FPCB taken along the line II-II' of FIG. 1.

As shown in FIG. 2B, the leg section 116 includes a frame layer 10 comprising a first cover layer 12 and a first adhesive layer 14, a conductive layer 22 and a solder pad 119.

The solder pad 119 is an element which is soldered to a solder pad of another printed circuit board, and may be formed of nickel (Ni), gold (Au) or an alloy thereof to be formed on the conductive layer 22. The first cover layer 12, the first adhesive layer 14 and the conductive layer 22 are identical to those described with reference to FIG. 2A, and thus their description will be omitted.

Next, a method of fabricating the LED FPCB described with reference to FIGS. 2A and 2B will now be described.

First, the first adhesive layer 14 is formed on the first cover layer 12 to produce the frame layer 10. Then, the second adhesive layer 26 is formed on the second cover layer 28 and the conductive layer 22 is formed on the second adhesive layer 26 to produce the unit layer 20.

Subsequently, the conductive layer 22 of the unit layer 20 is adhered to the first adhesive layer 14 of the frame layer 10 to join the frame layer 10 and the unit layer 20 to each other. Thereafter, the second cover layer 28 and the second adhesive layer 26 are removed from the region where the solder pad of the leg section 116 is formed and then nickel (Ni) or gold (Au) is coated thereon to form the solder pad 119. Lastly, the adhesive tape 113 is adhered to the outer surface of the second cover layer 28 of the body section 112.

Figure 3:
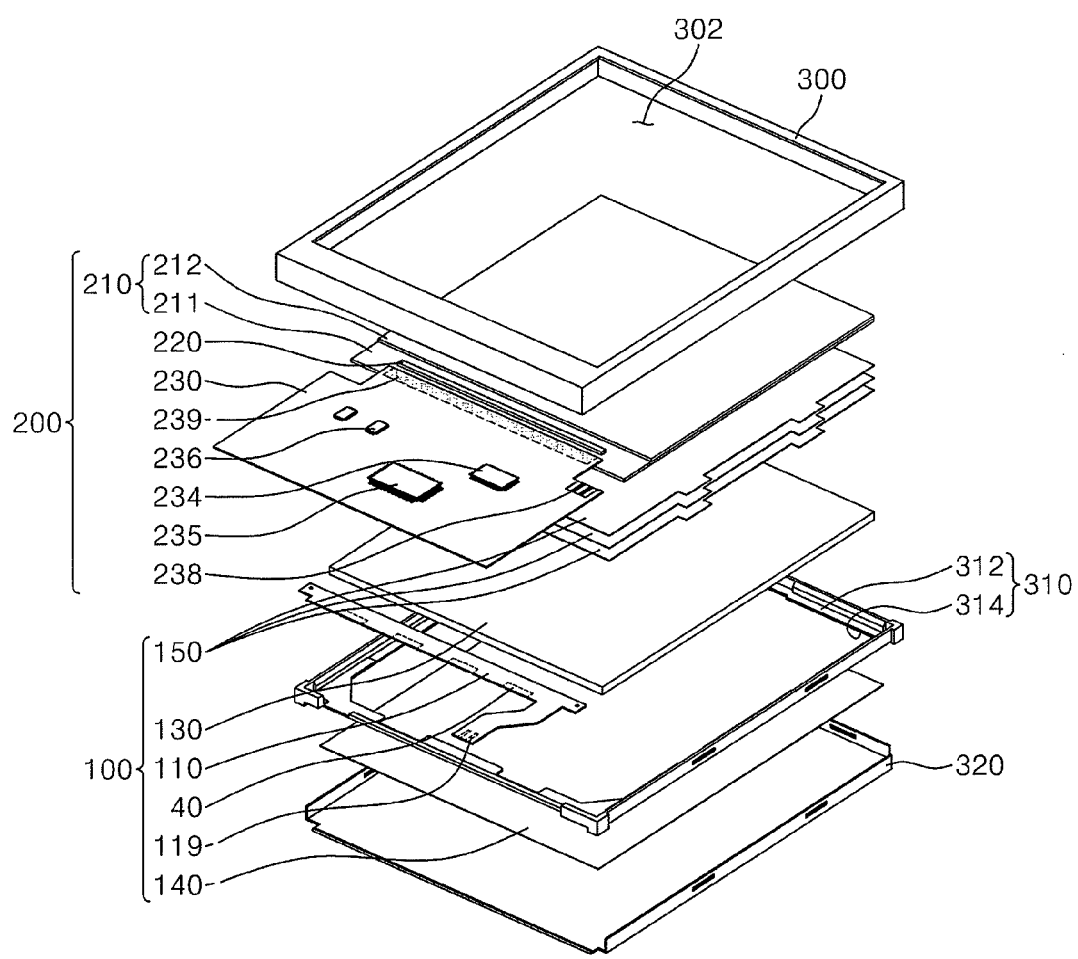
FIG. 3 is an exploded perspective view showing an LCD device according to an embodiment of the present invention.

FIG. 3 is an exploded perspective view showing an LCD device according to an embodiment of the present invention.

As shown in FIG. 3, the liquid crystal display device according to an embodiment of the present invention includes a liquid crystal panel assembly 200, a backlight assembly 100, a top sash 300, a mold frame 310 and an accommodating container 320.

The liquid crystal panel assembly 200 includes a liquid crystal panel 210, a driving chip 220 and a main circuit board 230. The liquid crystal panel 210 includes a TFT substrate 211, a color filter substrate 212 coupled to the TFT substrate 211 in such a fashion as to confront the TFT substrate 211 and a liquid crystal layer (not shown).

The TFT substrate 211 is a transparent glass substrate on which a plurality of TFTs (not shown) as switching elements are formed in the shape of a matrix. A data line and a gate line are connected to a source terminal and a gate terminal of each of the TFTs, respectively, and a pixel electrode made of a transparent conductive material is connected to a drain terminal of the TFT. The color filter substrate 212 is a substrate in which a color pixel consisting of red, green and blue colors is formed by a thin film process to express a certain color upon the transmission of light therethrough. The color filter substrate 212 is disposed to confront the TFT substrate 211 in such a fashion as to be spaced apart from the TFT substrate 211 by a predetermined interval.

The driving chip 220 is mounted at one side of the TFT substrate 211 to apply a driving signal to the data line and the gate line. The driving chip 220 can be configured as a single chip into which a data driving chip for applying a data signal to the data line and a gate driving chip for applying a gate signal to the gate line are integrated. Alternatively, the driving chip 220 may be configured as two chips, i.e., the data driving chip and the gate driving chip which are separate.

The main circuit board 230 applies a control signal for controlling the driving chip 220, the data signal, etc., to the TFT substrate 211, and applies the driving power for driving the LED to the LED FPCB 110.

To this end, the main circuit board 230 includes a timing controller 235 for generating a control signal for the driving chip 220, a memory 236 for storing a data signal, an LED power supply unit 234 for supplying power to the LED, etc, which are mounted on one surface thereof. Also, the main circuit board 230 includes a main solder 239 formed thereon to allow the main circuit board 230 to be adhered to the TFT substrate 211 mounted with the driving chip 220. The main solder 239 of the main circuit board 230 can be electrically connected to the TFT substrate 211 by means of an anisotropic conductive film. Formed on the other surface of the main circuit board 230 is a solder pad 238 soldered to the solder pad 119 of the LED FPCB(110).

Meanwhile, the main circuit board 230 has suitably patterned first and second conductive layers (not shown) therein to supply signals or power supplied from the timing controller 235, the memory 236 and the LED power supply unit 234 to the liquid crystal panel 210 and the LED FPCB 110.

Also, the solder pad 238 of the main circuit board 230 can be electrically connected to the LED power supply unit 234 through the first or second conductive layer.

When the solder pad 238 of the main circuit board 230 and the solder pad 119 of the LED FPCB 110 are soldered to each other to allow the main circuit board 230 and the LED FPCB 110 to be electrically interconnected, the LED power supply unit 234 supplies a driving power to the plurality of LED packages 40 embedded in the FPCB 110 to cause the LEDs to be driven. In this case, the main circuit board 230 may be a printed circuit board (PCB) or an FPCB.

The backlight assembly 100 includes an LED FPCB 110, a light guide plate 130, a reflective plate 140 and optical sheet element 150. The LED FPCB 110 may be the FPCB shown in FIG. 1.

The light guide plate 130 receives light emitted from the LED package embedded in the LED FPCB 110 through an incident surface thereof to change the path of the light to allow the light to be directed toward the liquid crystal panel 210. To this end, the body section 112 of the LED FPCB 110 embedded with the LED package 40 is attached to an edge of the incident surface side of the light guide plate 130. Thus, the solder pad 19 of the LED FPCB 110 is oriented opposite to the reflective plate 140.

The reflective plate 140 is disposed below the light guide plate 130 to reflect light leaked downwardly from the light guide plate 130 toward the light guide plate 130 to thereby improve the use efficiency of the light. The optical sheet element 150 includes a polarizing sheet, a prism sheet and a diffusion sheet, and serves to improve the luminance property of light emitted from the light guide plate 130.

The mold frame 310 includes a first seating surface 312 and a second seating surface 314 opposite to the first seating surface 312. The optical sheet element 150 and the liquid crystal panel 210 are sequentially seated on the first seating surface 312 of the mold frame 310. The light guide plate 130, the LED FPCB 110 attached to the light guide plate 130 and the reflective plate 140 are sequentially seated on the second seating surface 314 of the mold frame 310.

The top sash 300 is formed with an opening 302 for exposing the effective area of the liquid crystal panel 210. The top sash 300 functions to encircle the liquid crystal panel assembly 200 and is coupled to the accommodating container 320 to securely fix the liquid crystal panel 210 to the top portion of the backlight assembly 100. The accommodating container 320 is fastened to the mold frame 310 in which the reflective plate 140, the light guide plate 130, the optical sheet element 150 and the liquid crystal panel assembly 200 are sequentially received. At this time, the accommodating container 320 is coupled to the top sash 300. The top sash 300 and the accommodating container 320 protects the liquid crystal panel assembly 200 from an external impact, and prevents the liquid crystal panel assembly 200 from escaping from the backlight assembly 100.

Next, the coupling relationship between the main circuit board 230 and the LED FPCB 110 will be described hereinafter with reference to FIGS. 4A and 4B.

Figure 4A:
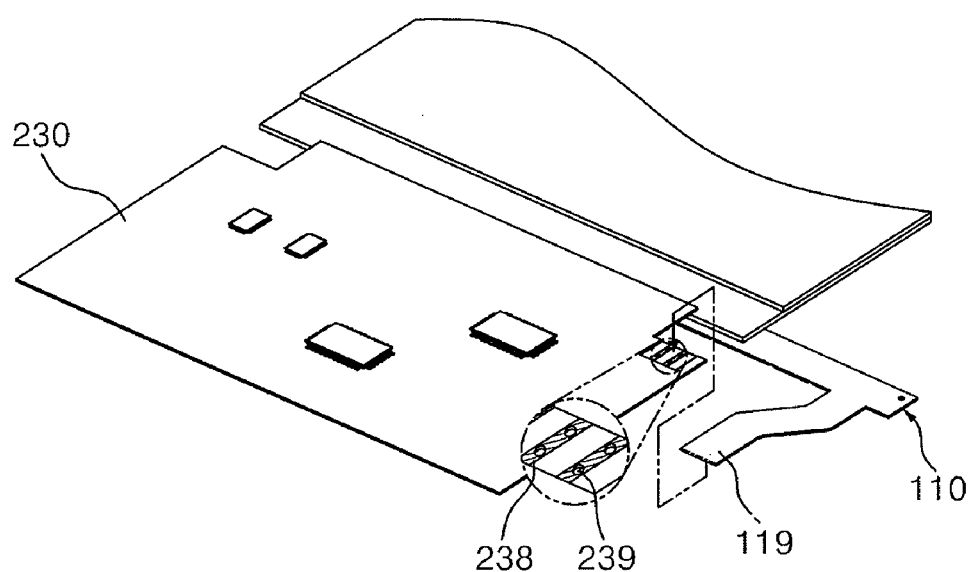
FIG. 4A is a perspective view showing the coupling relationship between a main circuit board and an LED FPCB of FIG. 3.

FIG. 4A is a perspective view showing the coupling relationship between a main circuit board 230 and an LED FPCB 110 of FIG. 3.

Referring to FIG. 4A, the solder pad 238 formed on the main circuit board 230 has via holes 239 formed therein to electrically interconnect the first and second conductive layers (not shown).

The solder pad 119 of the LED FPCB 110 is disposed in such a fashion as to rest on the solder pad 238 of the main circuit board 230. In this state, when a solder (not shown) is filled into the via holes 239 from the solder pad 238 side of the main circuit board 230, the solder pad 119 of the LED FPCB 110 and the solder pad 238 of the main circuit board 230 are soldered to each other so that they are electrically interconnected by means of a solder 240.

Now, the coupling relationship between the main circuit board 230 and the LED FPCB 110 will be described hereinafter in more detail with reference to FIG. 4B.

Figure 4B:
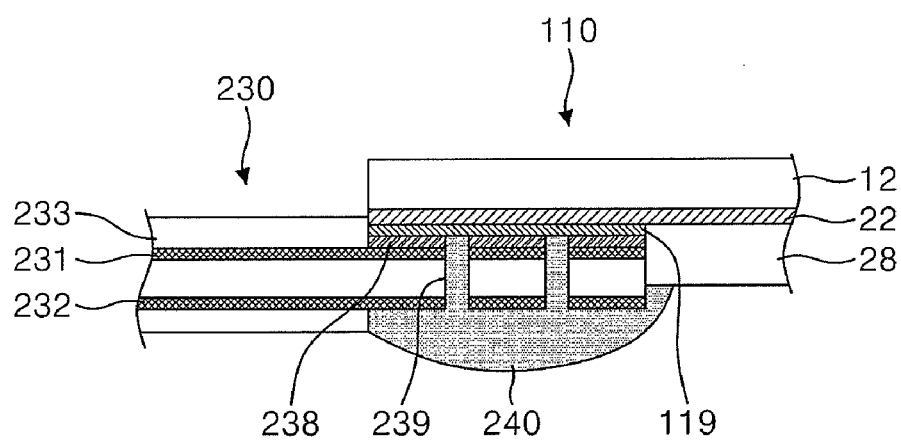
FIG. 4B is a partial cross-sectional view showing the coupling state between the main circuit board and the LED FPCB of FIG. 4A.

FIG. 4B is a partial cross-sectional view showing the coupling portion between the main circuit board 230 and the LED FPCB 110 of FIG. 4A.

Referring to FIG. 4B, the main circuit board 230 internally includes a first conductive layer 231 on which the solder pad 238 is formed and a second conductive layer 232. The first conductive layer 231 and the second conductive layer 232 have a multi-wiring layer structure for supplying signals from a plurality of electronic devices such as the timing controller, the LED power supply unit, etc., as shown in FIG. 3, to the liquid crystal panel 210 and the LED FPCB 110. In this manner, in case a conductive layer having more than one layer is used as signal wiring for electronic devices, a plurality of electronic devices can be integratedly mounted in the main circuit board 230 even though the size of the main circuit board 230 is small.

The first conductive layer 231 is electrically connected to the LED power supply unit 234 of FIG. 3, and the second conductive layer 232 is used as a conductive layer for allowing the main circuit board 230 to be soldered to the LED FPCB 110. More specifically, the second conductive layer 232 used as a conductive layer for soldering is formed in the same layer together with a signal wiring, but is electrically insulated from the signal wiring. The conductive layer for soldering may be formed without a separate additional process in the course of forming the signal wiring using a multi-conductive layer.

The solder pad 238 is formed on the top surface of the first conductive layer 231 from which a cover layer 233 of the main circuit board 230 is removed. The solder pad 238 is internally formed with at least one via hole 239 for electrically interconnecting the first conductive layer 231 and the second conductive layer 232.

In addition, the LED FPCB 110 internally includes a single conductive layer 22. The solder pad 119 of the LED FPCB 110 is formed on the underside of the conductive layer 22 from which the second cover layer 28 is removed.

The solder pad 119 of the LED FPCB 110 is attached to the solder pad 238 of the main circuit board 230 and electrically connected thereto through the soldering of the second conductive layer 232 side of the main circuit board 230 in a state of being in contact with the solder pad 238 of the main circuit board 230. At this time, the first conductive layer 231 is electrically connected to the second conductive layer 232 by means of the solder 240 filled into the via holes 239.

According to an embodiment of the present invention, the main circuit board 230 includes the first conductive layer 231 and the second conductive layer 232 constituting the signal wiring of the control circuit, etc., whereas the LED FPCB 110 includes only a single conductive layer 22 for electrically interconnecting the LED packages and the solder pad 119. That is, according to an embodiment of the present invention, it is possible to solder the LED FPCB having the single conductive layer to the main circuit board using the double-conductive layer structure of the main circuit board including the first conductive layer and the second conductive layer. Accordingly, an LED FPCB according to an embodiment of the present invention includes only a single conductive layer, as opposed to an LED FPCB employing a double conductive layer used in a conventional liquid crystal display device, decreasing the thickness of the FPCB to increase flexibility of the printed circuit board and reduce the manufacturing cost.

While an embodiment of the present invention has been described and illustrated in conjunction with a main circuit board and LED FPCB used in a liquid crystal display device, embodiments of the present invention are not limited thereto but may be diversely applied to other cases, such as where two different printed circuit boards are coupled to each other. For example, a first printed circuit board connected to another device while being embedded with a plurality of electronic circuit components includes the first and second conductive layers for transferring signals from the electronic circuit components to the liquid crystal panel 210 and the LED FPCB 110. A second printed circuit board attached to the first printed circuit board can be manufactured to have a single conductive layer structure connected to the electronic circuit components.

While the invention has been described in connection with what is presently considered to be practical exemplary embodiments, it is to be understood that the embodiment is merely exemplary and other embodiments of the invention are not limited to the disclosed embodiments. Therefore, a person skilled in the art can perform various changes and modifications and still fall within the scope of other embodiments of the present invention. Therefore, the scope of the present invention should not be construed as being limited to the above described embodiment, but should be defined by the appended claims and the equivalents to the claims.

What is claimed is:

1. A liquid crystal display device comprising:
    a liquid display panel;
    a first circuit board electrically connected to the liquid display panel, the first circuit board having first and second conductive layers formed therein and a first solder pad formed therein to be electrically connected to the first conductive layer; and
    a second circuit board having a second solder pad formed therein to be soldered to the first solder pad and a third conductive layer formed therein to be electrically connected to the second solder pad,
    wherein the first circuit board has a first surface and a second surface facing the first surface, the liquid display panel is disposed on the first surface, and the first solder pad is disposed on the second surface,
    wherein the second circuit board has a light source portion embedded therein that is electrically connected to the third conductive layer, and
    wherein the first solder pad has a via hole formed therein, and the first solder pad is electrically connected to the second solder pad through the via hole.

2. The liquid crystal display device according to claim 1, wherein the first circuit board has a power supply unit embedded therein, the first circuit board is positioned at one side of a region thereof where the first solder pad is formed, and the power supply unit is electrically connected to the first conductive layer.

3. The liquid crystal display device according to claim 2, wherein the light source portion comprises a light emitting diode (LED).

4. The liquid crystal display device according to claim 3, wherein the first and second solder pads are soldered to each other through the filling of a solder into the via holes in close contact with each other.

5. The liquid crystal display device according to claim 4, wherein the first and second circuit boards are flexible printed circuit boards.

6. The liquid crystal display device according to claim 4, wherein the first circuit board is a printed circuit board.

7. The liquid crystal display device according to claim 5, wherein the second circuit board further comprises: a body section having the light source portion embedded therein; and a leg section having the second solder pad formed therein, the leg section being extended from the body section and integrally formed with the body section, and wherein the third conductive layer is formed across the body section and the leg section for electrically interconnecting the light source portion and the second solder pad.

8. The liquid crystal display device according to claim 7, wherein the body section further comprises a first cover layer and a second cover layer, and the third conductive layer is formed between the first cover layer and the second cover layer.

9. The liquid crystal display device according to claim 8, wherein a region where the second solder pad of the leg section is formed further includes the first cover layer, and the third conductive layer is formed between the first cover layer and the second solder pad.

10. The liquid crystal display device according to claim 9, wherein the third conductive layer comprises copper.

11. The liquid crystal display device according to claim 10, wherein the second solder pad comprises nickel or gold.

12. A method of fabricating a liquid crystal display device, comprising:
   providing a first circuit board having first and second conductive layers formed therein and a first solder pad formed therein electrically connected to the first conductive layer, the first solder pad having via holes formed therein;
   electrically connecting the first circuit board to a liquid crystal panel;
   providing a second circuit board having a second solder pad formed therein to be soldered to the first solder pad and a third conductive layer formed therein;
   allowing the second solder pad of the second circuit board to be in close contact with the first solder pad having the via holes formed therein; and
   soldering the first soldering pad and the second soldering pad to each other through the filling of a solder into the via holes from the first circuit board side,
   wherein the first circuit board has a first surface and a second surface facing the first surface, the liquid display panel is disposed on the first surface, and the first solder pad is disposed on the second surface, and
   wherein the second circuit board has a light source portion embedded therein that is electrically connected to the third conductive layer.

13. The method according to claim 12, wherein the first circuit board has a power supply unit embedded therein, the first circuit board is positioned at one side of a region thereof where the first solder pad is formed, and the power supply unit is electrically connected to the first conductive layer.

14. The method according to claim 13, wherein the first and second circuit boards are flexible printed circuit boards.

* * * * *